(12) United States Patent
Ali et al.

(10) Patent No.: US 7,117,467 B2
(45) Date of Patent: Oct. 3, 2006

(54) METHODS FOR OPTIMIZING PACKAGE AND SILICON CO-DESIGN OF INTEGRATED CIRCUIT

(75) Inventors: Anwar Ali, San Jose, CA (US); Stan Mihelcic, Pleasanton, CA (US); James G. Monthie, Fulton, MD (US)

(73) Assignee: LSI Logic Corporation, Milpitas, CA (US)

( * ) Notice: Subject to any disclaimer, the term of this patent is extended or adjusted under 35 U.S.C. 154(b) by 181 days.

(21) Appl. No.: 10/918,933

(22) Filed: Aug. 16, 2004

(65) Prior Publication Data

US 2006/0036987 A1    Feb. 16, 2006

(51) Int. Cl.
*G06F 17/50* (2006.01)
*H01L 21/44* (2006.01)
*H01L 21/48* (2006.01)
*H01L 21/50* (2006.01)
*H01L 23/488* (2006.01)

(52) U.S. Cl. .............. 716/10; 716/9; 716/15; 438/108; 257/777; 257/778; 257/676; 257/678

(58) Field of Classification Search ............ 716/9, 716/10, 15; 438/108; 257/777, 778, 676, 257/678
See application file for complete search history.

(56) References Cited

U.S. PATENT DOCUMENTS

| 6,594,811 B1* | 7/2003 | Katz ..................... 716/12 |
| 6,941,537 B1* | 9/2005 | Jessep et al. ............ 716/15 |
| 6,952,814 B1* | 10/2005 | Joseph et al. ........... 716/12 |
| 2003/0032217 A1* | 2/2003 | Farnworth et al. ....... 438/108 |
| 2004/0098690 A1* | 5/2004 | Joseph et al. ........... 716/12 |
| 2005/0127483 A1* | 6/2005 | Joshi et al. ............ 257/676 |
| 2005/0269714 A1* | 12/2005 | Akram et al. ........... 257/778 |

* cited by examiner

*Primary Examiner*—Phallaka Kik
(74) *Attorney, Agent, or Firm*—Suiter·West·Swantz PC LLC

(57) ABSTRACT

The present invention is directed to methods for optimizing package and silicon co-design of an integrated circuit. A composite bump pattern for an integrated circuit is created based on a first library including at least one bump pattern template. PCB and Die constraints of the integrated circuit are then reviewed. A partial package design for the integrated circuit is generated based on a second library including at least one partial package template. A partial silicon design for said integrated circuit is started. A full package design for the integrated circuit is then completed. A full silicon design for the integrated circuit is completed.

32 Claims, 4 Drawing Sheets

METHODS FOR OPTIMIZING PACKAGE AND SILICON CO-DESIGN OF INTEGRATED CIRCUIT

FIELD OF THE INVENTION

This invention relates generally to integrated circuits, and particularly to methods for optimizing package and silicon co-design of an integrated circuit.

BACKGROUND OF THE INVENTION

Modern semiconductors are assembled in either wirebonded or flipchip packages. In either case, the package provides the interconnect between the fine geometries of the silicon design and wider pitches at the circuit board level. The package also serves as environmental protection for the silicon die. With increasing IO (Input/Output) densities and total IO counts, faster signaling speeds, and sharper IO slew rates, the package interconnect has become an integral part of both the silicon and board level design considerations. Specifically, it has forced the need for packages which are highly tuned and customized to a particular silicon design and board application. This level of customization may result in highly detailed studies and extensive development schedules during package and silicon co-design.

Various silicon and package co-design environments exist with varying levels of automation. Invariably, these conventional solutions are comprised of three, sometimes four, components (see, e.g., FIG. 1). Each major component of the solution, namely the Silicon Design, the Package Design, the Board Design, and the Electrical Modeling, are completed by appropriate engineering teams. Use of automation is commonly used across all four areas. The level of automation often propagates results across each of the four areas. For example, the silicon designer may view the package design in-place as the chip IOs are assigned. Likewise, the package designer may view the silicon design and locations of IO circuits in-place so that the positioning of package wirebond fingers of flipchip bump pads can be optimized. Since there is a high degree of interaction in each of the four areas, the work flow for converging on a solution requires piecemeal progress on each topic. In other words, the total solution is achieved by locating IO circuits in the silicon design, completing components of the package design, conducting electrical modeling, conducting board layout studies, conducting further optimization of the silicon, making further changes to the package, re-visiting the electrical modeling, and so on (see, e.g., FIG. 2). It is noteworthy that there is no fixed or exact sequencing of effort in the areas of Silicon Design, Package Design, Board Design, or Electrical Modeling. Design specific constraints often dictate the number of times and at which points each area is revisited.

The conventional approaches ensure all Package Design, Silicon Design, Electrical Modeling, and Board Layout considerations are addressed collectively. The level of closure in each step of the work flow may be varied. For example, a very rough silicon IO assignment may be completed before conducting some initial package design work. Likewise, a near final IO assignment may be conducted before some initial package design work starts. This level of granularity may be varied with each application of the conventional approaches for a specific Silicon and Package co-design exercise. The level of granularity may be dictated by the complexity of constraints in each of these four areas.

However, the conventional approaches have the following disadvantages. First, in practice, the conventional work flow may be highly iterative. For example, the silicon designer may opt to place a specific SERDES (Serializer/Deserializer) high-speed IO interface at a particular die location. This may force the package designer to optimize the respective region of the package design. As a side-effect, this may require other components of the package design to be adjusted. Undesirable impacts of these changes may only be exposed during electrical modeling, which may force the silicon designer to move other IO circuits on the die, or reconsider the necessity of the specific SERDES placement location. Moreover, the conventional approaches may result in long Silicon and Package co-design development cycles since each area need be re-evaluated multiple times, and in some cases, completely restarted. Furthermore, the conventional work flow has no closed loop controllability and as a result, it becomes difficult to predict cycle times for a given Silicon and Package co-design exercise. In addition, supporting such a work flow requires extensive resourcing to service the many and often fine grained iterations between Silicon, Package, Board Designs and Electrical Modeling. Resources must be assigned in all four areas, and permanently available to re-evaluate changes as required. The manpower resourcing of the conventional approaches is therefore very costly. Further, extensive tool automation and tool investment are required to assist in cross-propagating Silicon, Package, Board, and Electrical data. Invariably, design teams use a combination of off-the-shelf EDA (Electronic Design Automation) tools coupled with their own internal utilities to bridge data from one system to another. This often requires costly tool investment and development.

Thus, it would be desirable to provide a package and silicon co-design solution to the foregoing-described problems.

SUMMARY OF THE INVENTION

It is an object of the present invention to provide a means to concurrently design both a package and silicon die.

It is an additional object of the present invention to provide a design method that is integrated and affords efficient development cycles for both silicon and package components.

It is another object of the present invention to provide a design method that avoids iteration between package design and silicon design since iteration may result in major reworks in both areas.

It is a further object of the present invention to provide a design method that addresses complex signal integrity constraints imposed by high-speed IO interfaces.

It is still a further object of the present invention to provide a design method that addresses high IO densities and total IO counts required by semiconductor applications.

It is yet still a further object of the present invention to provide a design method that is scalable for all package and silicon co-design applications across all technologies, wirebond, and flipchip package types.

In an exemplary aspect of the present invention, a method for optimizing package and silicon co-design of an integrated circuit includes steps as follows. A composite bump pattern for an integrated circuit is created based on a first library including at least one bump pattern template. PCB (Printed Circuit Board) and Die constraints of the integrated circuit are then reviewed. A partial package design for the integrated circuit is generated based on a second library including at least one partial package template. A partial silicon design for said integrated circuit is started. A full package design for the integrated circuit is then completed. A full silicon design for the integrated circuit is completed.

In an additional exemplary aspect of the present invention, a method for optimizing package and silicon co-design of an integrated circuit includes steps as follows. A composite bump pattern for an integrated circuit is created based on a first library including at least one bump pattern template. PCB and Die constraints of the integrated circuit are then reviewed. A full package design for the integrated circuit is generated based on a second library including at least one partial package template. A full silicon design for the integrated circuit is then completed.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention provides new methods for silicon and package co-design. Traditional approaches introduce highly iterative steps between silicon, package, and board design, and electrical modeling. These approaches prove to be costly from several aspects including automation and engineering effort. The present approach may eliminate iteration by creating bump and package templates, which can be quickly assembled for a specific design scenario by manual or automation methods. These templates are pre-designed and characterized building blocks for specific portions of a die or IP (Intellectual Property) interface. The present approach may remove the need for iteration and reduce cycle times.

According to the present invention, two template libraries are present. One library includes bump pattern templates, and the other includes partial package template. These libraries may be used across multiple designs. The Bump Pattern Templates library contains pre-designed die based bump and flipchip interconnect patterns such as for the corner (see, e.g., FIG. 4A) and for the side (see, e.g., FIG. 4C). The library may include templates for commonly used IP interfaces such as SERDES (see, e.g., FIG. 4B) and DDR (Double Data Rate) (see, e.g., FIG. 4D). These templates may be assembled to create a composite bump pattern and flipchip die interconnect. Templates are pre-characterized and define a fixed package bump to IO circuit mapping.

The Partial Package Templates library contains pre-defined substrate routing patterns from die bump to package ball, using similar concepts to the bump pattern template. The library includes templates for commonly used IP interfaces such as SERDES. These templates may be assembled to create a composite bump to package ball interconnect. Templates are pre-designed and characterized.

Figure 1:
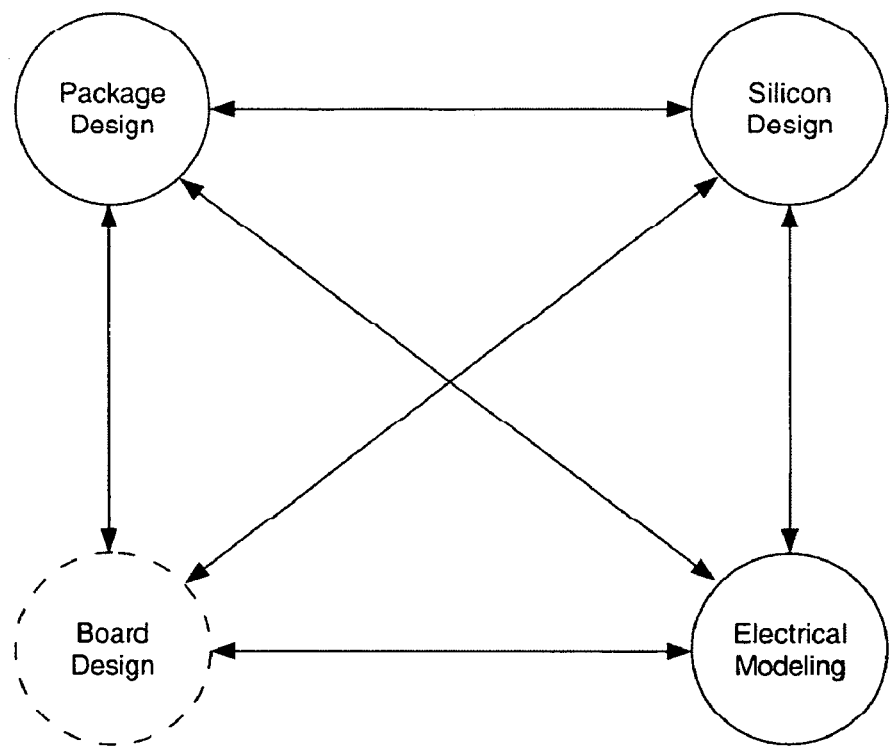
FIG. 1 is a schematic diagram showing conventional package and silicon co-design environment architecture.
Figure 2:
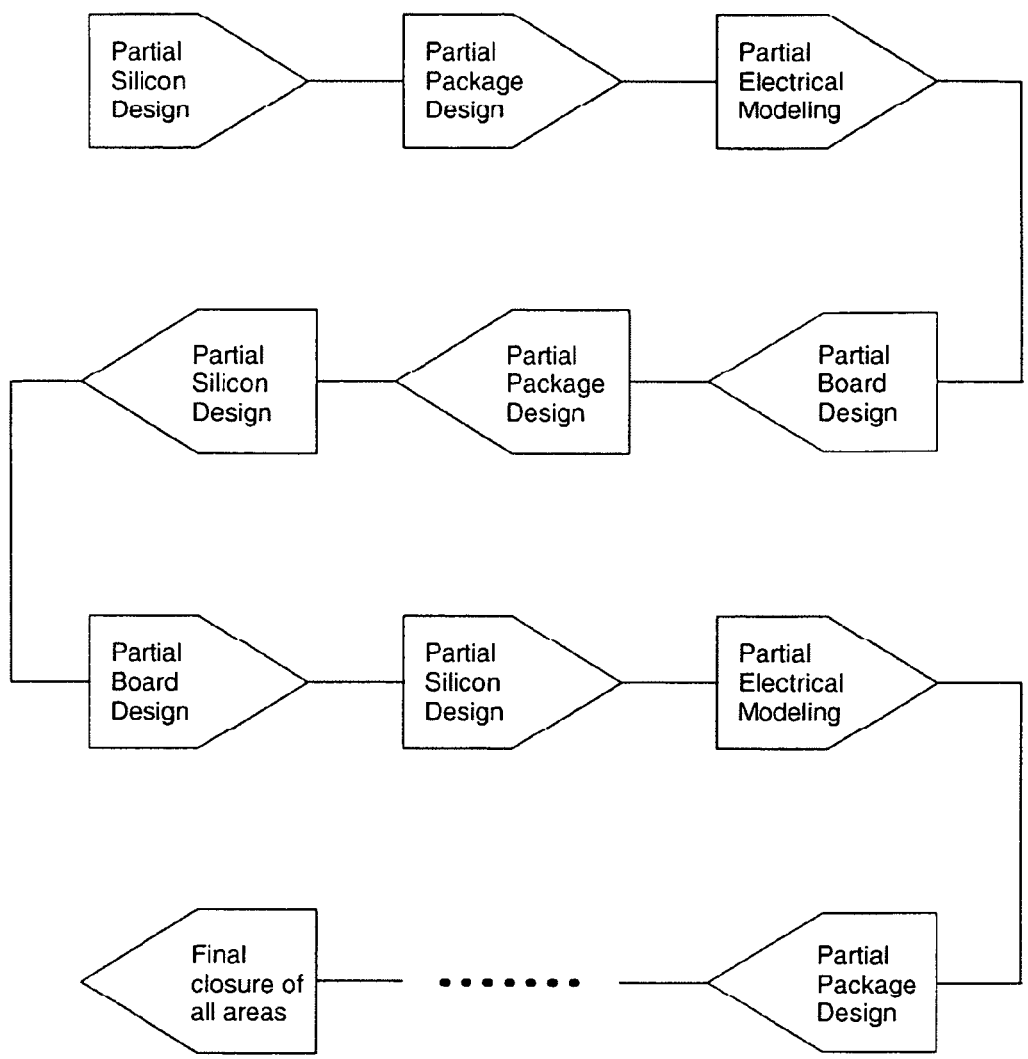
FIG. 2 is a flow diagram showing a conventional package and silicon co-design method.
Figure 3:
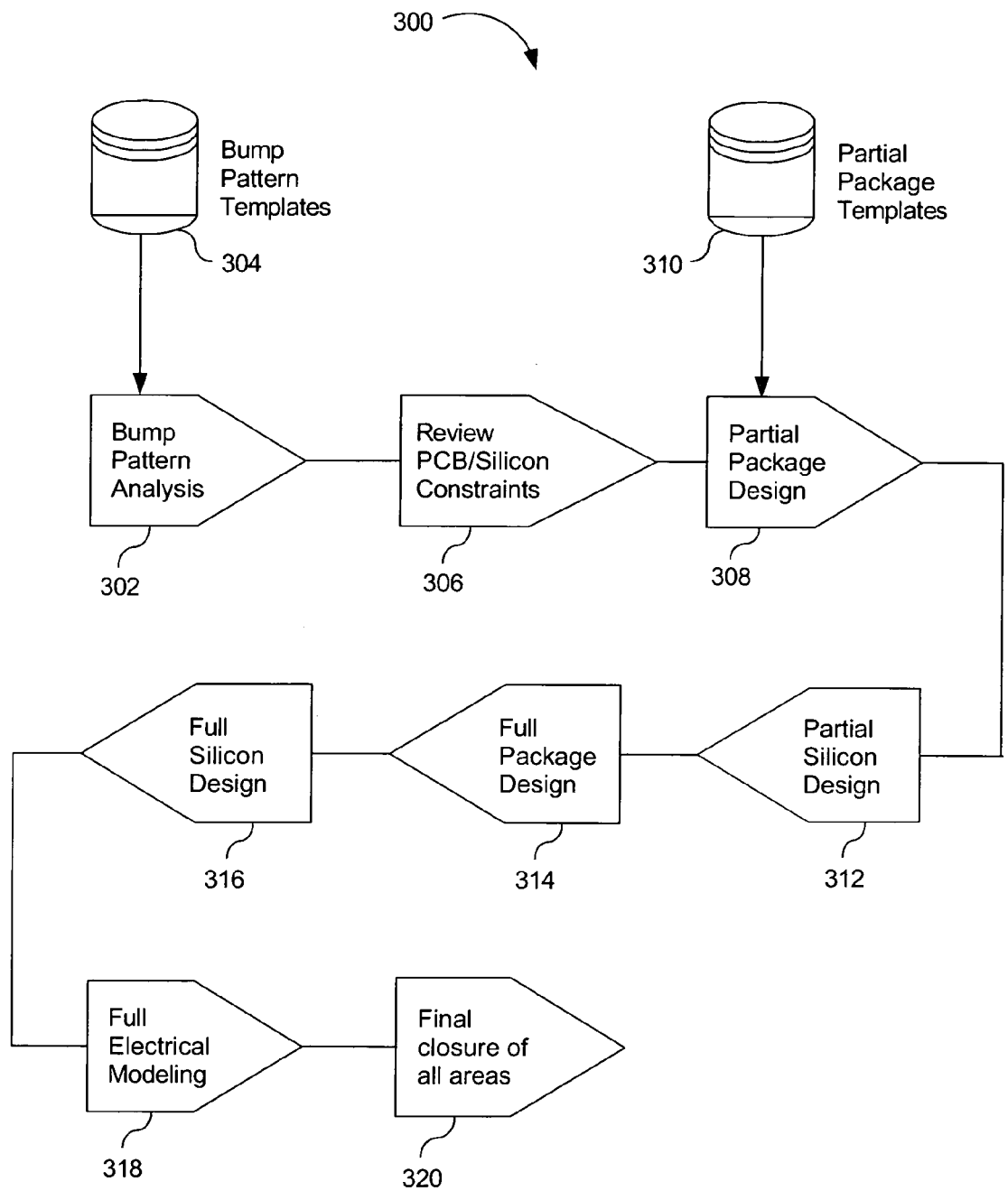
FIG. 3 is a flow diagram of a method for optimizing package and silicon co-design of an integrated circuit in accordance with an exemplary embodiment of the present invention.
Figure 4A:
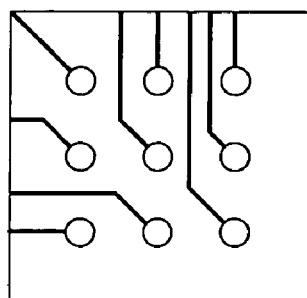
FIG. 4A shows a corner bump pattern template in accordance with an exemplary embodiment of the present invention.
Figure 4B:
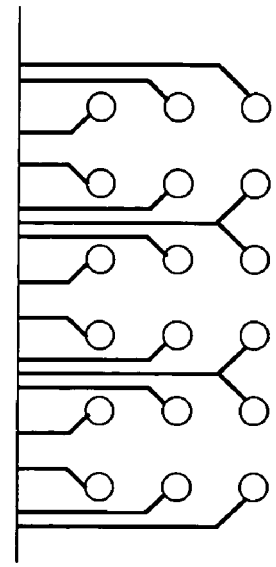
FIG. 4B shows a SERDES bump pattern template in accordance with an exemplary embodiment of the present invention.
Figure 4C:
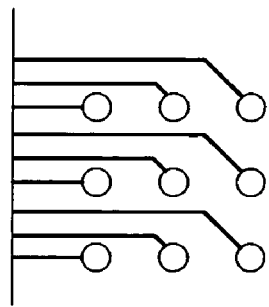
FIG. 4C shows a side bump pattern template in accordance with an exemplary embodiment of the present invention.
Figure 4D:
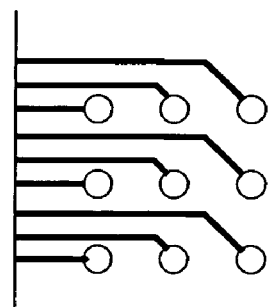
FIG. 4D shows a DDR bump pattern template in accordance with an exemplary embodiment of the present invention.

FIG. 3 is a flow diagram of a method 300 for optimizing package and silicon co-design of an integrated circuit in accordance with an exemplary embodiment of the present invention. The method 300 may start with bump pattern analysis step 302. In step 302, a composite bump pattern for an integrated circuit is created based on a first library 304 including at least one bump pattern template. Exemplary bump pattern templates are shown in FIGS. 4A though 4C. A bump pattern template may be created with fine or course granularity. For example, a template for an entire die edge can be created, or similarly, for only a group of four IO devices. The Bump Pattern Analysis step 302 is the first point in the IO planning phase of a new chip design. This step involves looking at the various bump pattern templates and creating a composite bump pattern. For example, if the target design contains two SERDES interfaces, four groups of 72 bit DDR interfaces, and 100 regular IOs including wrapping each of the four die corners, the appropriate items from the library 304 may be chosen. These individual templates are then assembled to create a composite bump pattern. Since this process is deterministic, the bump pattern creation process may be generated in a matter of minutes through software automation.

PCB (Printed Circuit Board) and Die constraints of the integrated circuit are then reviewed 306. If the pre-defined templates do not meet constraints in specific regions of the die or package pin-out, new templates are designed and added to the library 304.

Next, in step 308, a partial package design for the integrated circuit is generated based on a second library 310 including at least one partial package template. The partial package design is generated by assembling the associate partial package templates. Partial package template may be created with fine or course granularity. For example, a template for an entire die edge can be created, or similarly, for only a group of four IO devices. These individual templates are assembled to create a composite package design. Alternatively, the second library 310 and the first library 304 may be combined into a single library. Since this process is deterministic, a partial package design may be generated in a matter of minutes through software automation.

A partial silicon design for said integrated circuit is started 312. Partial aspects of the silicon design, including IO assignment, may be started since the package pin-out and die layout are governed by the combination of bump and package templates.

A full package design for the integrated circuit is then completed 314. Once the partial silicon design is complete, a full package design may be completed and may be used to re-affirm the original collection of package design templates.

A full silicon design for the integrated circuit is completed 316. A full electrical modeling is completed 318. This step may not expose any new issues since all bump and package design templates have been previously characterized. Final closure of all areas is reached 320.

In the method 300 shown in FIG. 3, alternatively, a full silicon and full package design may be completed without requiring intermediate/partial steps. The full electrical modeling step 318 may be eliminated if the templates are simple.

It is understood that the present invention may be applied to any integrated circuit design, including platform-based integrated circuit design and the like, without departing from the scope and spirit of the present invention. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. For example, RapidChip™ developed by LSI Logic Corp. is an instance of a platform.

The present invention may have the following advantages. First, no iteration in the work flow is introduced. Silicon, Package, and Board designers may proceed independently without iteration or lost work owing to changes. In addition, all aspects including the Bump Pattern and Package Design are physically pre-designed and characterized. This allows all issues to be solved outside of a chip design cycle, and for the patterns to be re-used across multiple designs, thereby amortizing the cost of development. Moreover, effort can be focused on highly optimizing the templates ahead of time, and outside of a design cycle. This allows improved performance or IO density when used on a design. Furthermore, Silicon and Package co-design development cycles are reduced. Moreover, Silicon and Package co-design development cycles are predictable since there are no iterative loops. Additionally, resourcing to support the present methods is significantly reduced since Package, Silicon, and Board designers can focus on their individual efforts, and do not need to be available to service changes outside their domain. Further, the need for complex tool automation to back-annotate information between Silicon, PCB, and Package design is reduced, therefore reducing the overall cost of silicon-package co-design exercises.

It is to be noted that the foregoing described embodiments according to the present invention may be conveniently implemented using conventional general purpose digital computers programmed according to the teachings of the present specification, as may be apparent to those skilled in the computer art. Appropriate software coding may readily be prepared by skilled programmers based on the teachings of the present disclosure, as may be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for optimizing package and silicon co-design of an integrated circuit, comprising steps of:
    creating, based on a first library including at least one bump pattern template, a composite bump pattern for an integrated circuit;
    reviewing PCB and Die constraints of said integrated circuit;
    generating, based on a second library including at least one partial package template, a partial package design for said integrated circuit;
    starting a partial silicon design for said integrated circuit;
    completing a full package design for said integrated circuit; and
    completing a full silicon design for said integrated circuit.

2. The method of claim 1, wherein said creating step comprising:
    selecting a plurality of bump pattern templates from said first library; and
    assembling said plurality of bump pattern templates into said composite bump pattern.

3. The method of claim 1, wherein said creating step is performed through software automation.

4. The method of claim 1, wherein said at least one bump pattern template includes pre-designed die-based bump and flipchip interconnect patterns.

5. The method of claim 1, wherein said at least one bump pattern template is pre-characterized and defines at least one fixed package bump to IO circuit mapping.

6. The method of claim 1, wherein said at least one bump pattern template has fine or course granularity.

7. The method of claim 1, wherein said at least one bump pattern template includes at least one of a corner bump pattern template, a side bump pattern template, a SERDES bump pattern template, or a DDR bump pattern template.

8. The method of claim 1, wherein said at least one partial package template includes pre-defined substrate routing patterns from at least one die bump to at least one package ball.

9. The method of claim 1, wherein said first library and said second library are combined into a single library.

10. The method of claim 1, wherein said reviewing PCB and Die constraints of said integrated circuit comprising:
    when said at least one bump pattern template fails to meet said PCB and Die constraints in a die region or a package pin-out of said integrated circuit, designing a new bump pattern template and adding said new bump pattern template to said first library.

11. The method of claim 1, wherein said generating step comprising:
   selecting a plurality of partial package templates from said second library; and
   assembling said plurality of partial package templates into said partial package design.

12. The method of claim 1, wherein said generating step is performed through software automation.

13. The method of claim 1, wherein said partial silicon design includes IO assignment.

14. The method of claim 1, further comprising using said full package design to reaffirm said partial package design.

15. The method of claim 1, further comprising completing a full electrical modeling of said integrated circuit.

16. A computer-readable medium having computer-executable instructions for performing a method for optimizing package and silicon co-design of an integrated circuit, said method comprising:
   creating, based on a first library including at least one bump pattern template, a composite bump pattern for an integrated circuit;
   reviewing PCB and Die constraints of said integrated circuit;
   generating, based on a second library including at least one partial package template, a partial package design for said integrated circuit;
   starting a partial silicon design for said integrated circuit;
   completing a full package design for said integrated circuit; and
   completing a full silicon design for said integrated circuit.

17. The computer-readable medium of claim 16, wherein said method further comprises completing a full electrical modeling of said integrated circuit.

18. A method for optimizing package and silicon co-design of an integrated circuit, comprising steps of:
   creating, based on a first library including at least one bump pattern template, a composite bump pattern for an integrated circuit;
   reviewing PCB and Die constraints of said integrated circuit;
   generating, based on a second library including at least one partial package template, a full package design for said integrated circuit; and
   completing a full silicon design for said integrated circuit.

19. The method of claim 18, wherein said creating step comprising:
   selecting a plurality of bump pattern templates from said first library; and
   assembling said plurality of bump pattern templates into said composite bump pattern.

20. The method of claim 18, wherein said creating step is performed through software automation.

21. The method of claim 18, wherein said at least one bump pattern template includes pre-designed die-based bump and flipchip interconnect patterns.

22. The method of claim 18, wherein said at least one bump pattern template is pre-characterized and defines at least one fixed package bump to IO circuit mapping.

23. The method of claim 18, wherein said at least one bump pattern template has fine or course granularity.

24. The method of claim 18, wherein said at least one bump pattern template includes at least one of a corner bump pattern template, a side bump pattern template, a SERDES bump pattern template, or a DDR bump pattern template.

25. The method of claim 18, wherein said at least one partial package template includes pre-defined substrate routing patterns from at least one die bump to at least one package ball.

26. The method of claim 18, wherein said first library and said second library are combined into a single library.

27. The method of claim 18, wherein said reviewing PCB and Die constraints of said integrated circuit comprising:
   when said at least one bump pattern template fails to meet said PCB and Die constraints in a die region or a package pin-out of said integrated circuit, designing a new bump pattern template and adding said new bump pattern template to said first library.

28. The method of claim 18, wherein said generating step comprising:
   selecting a plurality of partial package templates from said second library; and
   assembling said plurality of partial package templates into said full package design.

29. The method of claim 18, wherein said generating step is performed through software automation.

30. The method of claim 18, further comprising completing a full electrical modeling for said integrated circuit.

31. A computer-readable medium having computer-executable instructions for performing a method for optimizing package and silicon co-design of an integrated circuit, said method comprising:
   creating, based on a first library including at least one bump pattern template, a composite bump pattern for an integrated circuit;
   reviewing PCB and Die constraints of said integrated circuit;
   generating, based on a second library including at least one partial package template, a full package design for said integrated circuit; and
   completing a full silicon design for said integrated circuit.

32. The computer-readable medium of claim 31, wherein said method further comprises completing a full electrical modeling for said integrated circuit.

* * * * *